(12) United States Patent
Garbe et al.

(10) Patent No.: US 9,508,421 B2
(45) Date of Patent: Nov. 29, 2016

(54) MEMORY DEVICE, STORAGE APPARATUS AND METHOD FOR DIAGNOSING SLOW MEMORY CELLS

(71) Applicant: FUJITSU LIMITED, Kawasaki-shi, Kanagawa (JP)

(72) Inventors: Michiyo Garbe, Yokohama (JP); Masahiro Ise, Machida (JP); Osamu Ishibashi, Kawasaki (JP); Yoshinori Mesaki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/924,779

(22) Filed: Oct. 28, 2015

(65) Prior Publication Data
US 2016/0180968 A1 Jun. 23, 2016

(30) Foreign Application Priority Data
Dec. 17, 2014 (JP) .................. 2014-254785

(51) Int. Cl.
*G11C 11/56* (2006.01)
*G11C 16/12* (2006.01)
*G11C 29/50* (2006.01)

(52) U.S. Cl.
CPC .......... *G11C 11/5628* (2013.01); *G11C 16/12* (2013.01); *G11C 29/50004* (2013.01); *G11C 29/50016* (2013.01); *G11C 2029/5004* (2013.01)

(58) Field of Classification Search
CPC .............. G11C 11/5628; G11C 16/12; G11C 29/50004; G11C 29/50016; G11C 2029/5004
See application file for complete search history.

(56) References Cited

U.S. PATENT DOCUMENTS

| 2004/0013000 | A1 | 1/2004 | Torii | |
|---|---|---|---|---|
| 2005/0083735 | A1* | 4/2005 | Chen | G11C 11/5628 365/185.17 |
| 2006/0077736 | A1 | 4/2006 | Nakagawa et al. | |
| 2006/0291291 | A1* | 12/2006 | Hosono | G11C 16/12 365/185.22 |
| 2008/0056035 | A1* | 3/2008 | Nazarian | G11C 16/12 365/201 |

FOREIGN PATENT DOCUMENTS

| JP | 2004-054966 | 2/2004 |
|---|---|---|
| JP | 2008-176826 | 7/2008 |
| WO | 2006/025083 | 3/2006 |

* cited by examiner

*Primary Examiner* — Richard Elms
*Assistant Examiner* — Ajay Ojha
(74) *Attorney, Agent, or Firm* — Fujitsu Patent Center

(57) ABSTRACT

A memory device comprises a memory block including a plurality of cells each including an erase state and a program state, respectively; and a control circuit configured to execute, in response to a program command, program operation of applying a pulse to each cell to charge an electric charge and transferring the cell from the erase state to the program state. The control circuit executes, in response to a diagnostic command, diagnostic operation of applying to a diagnostic target cell the pulse within a range that the diagnostic target cell in the erase state in a memory block including stored data is not shifted to the program state, and checking whether or not a charge speed of the diagnostic target cell is faster than or equal to a charge speed of a slowest-speed cell whose charge speed is the slowest among normal cells.

13 Claims, 17 Drawing Sheets

MEMORY DEVICE, STORAGE APPARATUS AND METHOD FOR DIAGNOSING SLOW MEMORY CELLS

CROSS-REFERENCE TO RELATED APPLICATION

This application is based upon and claims the benefit of priority of the prior Japanese Patent Application No. 2014-254785, filed on Dec. 17, 2014, the entire contents of which are incorporated herein by reference.

FIELD

The present invention relates to a memory device, a storage apparatus and a method for diagnosing the storage apparatus.

BACKGROUND

In place or in addition to the conventional storage apparatus using a hard disk as a memory medium, a storage apparatus called SSD (solid state drive), in which a semiconductor memory is used as a memory medium, is currently in wide use. As the SSD semiconductor memory, a flash memory using a cell transistor having a floating gate is generally used today.

The flash memory has a program operation in which a pulse is applied to the cell transistor to inject or charge electrons into the floating gate, and an erase operation in which a high voltage is applied to a substrate to extract or discharge electrons in the floating gate. This produces the problem of a deterioration in the flash memory by the passage of electrons due to a tunnel effect through the insulating film between the semiconductor substrate and the floating gate of the cell transistor. This deteriorated insulating film brings about an increased pulse count needed for the program operation.

As a result, it is needed to periodically diagnose the SSD storage apparatus mounted in a computer to check whether or not the deterioration occurs. On detection of deterioration, a continued use of such an SSD storage apparatus may cause a computer malfunction.

SSD storage apparatus is described in International Patent Application WO 2006/025083, the official gazette of the Japanese Laid-open Patent Publication No. 2004-054966 and No. 2008-176826.

SUMMARY

However, because the SSD storage apparatus loaded on the computer includes data stored therein, it is not possible to write diagnostic data into a storage area in which the data is stored. Therefore, it is not possible to detect, by ordinary write operation, the deterioration of the storage area in which data is already stored.

Further, in the SSD storage apparatus including the flash memory, generally it is not possible to overwrite diagnostic data in a storage area in which data is already stored. The reason is that the SSD storage apparatus internally includes a controller which converts an externally input logical address into a physical address to store write data into a physical address area, so that the controller, when requested to overwrite data in the logical address of the storage area in which data is stored, changes the physical address associated with the logical address to another physical address, to write new data into an area in which data is not stored.

One aspect of the disclosure is a memory device comprising: a memory block including a plurality of cells each including an erase state in which first data is stored and a program state in which second data is stored, respectively; and a control circuit configured to execute, in response to a program command, program operation of applying a pulse to each cell to charge an electric charge and transferring the cell from the erase state to the program state, wherein the control circuit executes, in response to a diagnostic command, diagnostic operation of applying to a diagnostic target cell the pulse within a range that the diagnostic target cell in the erase state in a memory block including stored data is not shifted to the program state, and checking whether or not a charge speed of the diagnostic target cell is faster than or equal to a charge speed of a slowest-speed cell whose charge speed is the slowest among normal cells.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
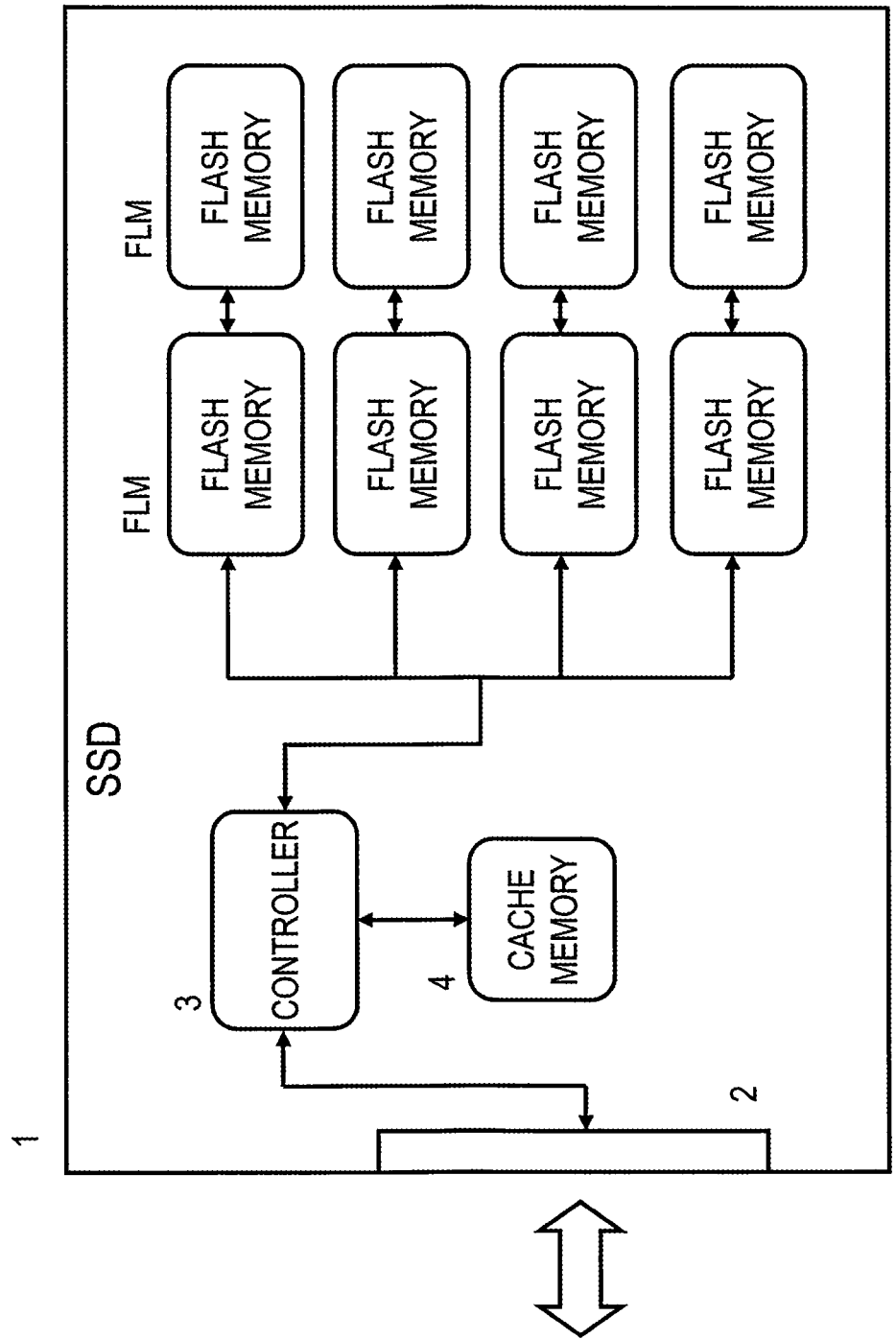
FIG. 1 is a diagram illustrating a configuration of a storage apparatus according to the present embodiment.

FIG. 1 is a diagram illustrating a configuration of a storage apparatus according to the present embodiment. A storage apparatus 1 includes: a singularity or a plurality of flash memories FLM; an input/output terminal 2 for inputting either a write request and write data thereof or a readout request; a controller 3 which controls the flash memory FLM in response to the write request and the readout request; and a cache memory 4 which temporarily stores the write data or the readout data. The flash memory FLM is a memory device constituted by one chip, for example.

The controller 3, in response to a write request issued from a computer (not illustrated), temporarily stores write data into the cache memory 4, to control write operation into the flash memory FLM. The write operation of the flash memory FLM is performed, for example, on a page-by-page basis in which a predetermined number of data are included. Also, in response to a readout request issued from the computer, the controller 3 controls readout operation from the flash memory FLM. The readout operation of the flash memory FLM is also performed on a page-by-page basis, for example.

For example, there may be a case when readout data is temporarily stored in the cache memory also at the readout.

Figure 2:
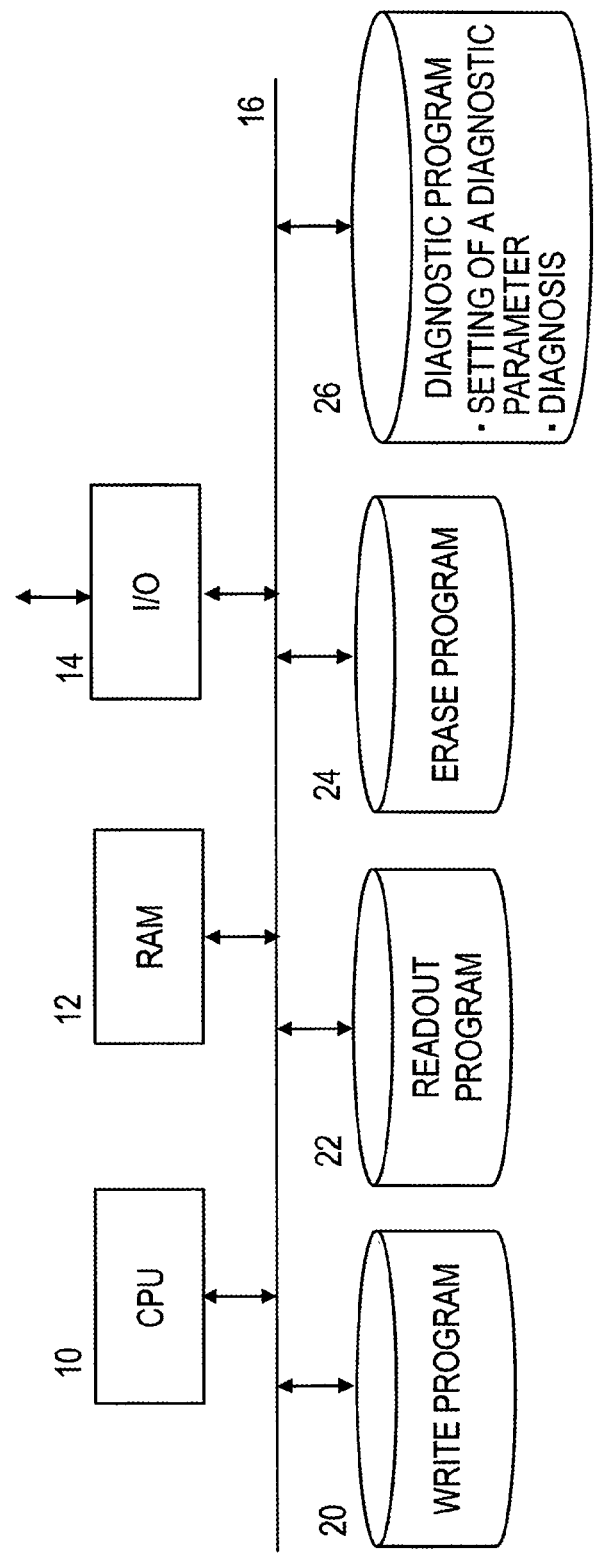
FIG. 2 is a diagram illustrating a configuration example of the controller.

FIG. 2 is a diagram illustrating a configuration example of the controller. The controller 3 is LSI, which includes an arithmetic processing unit 10 which is a microprocessor or a CPU, for example, a random access memory 12, and an input/output unit 14, which are connected through a bus 16. Further, the controller 3 includes a write program 20, a readout program 22 and an erase program 24 for the purpose of controlling the flash memory FLM. The CPU 10 executes the write program to control to write into the flash memory FLM, and also executes the readout program to control to read out from the flash memory FLM. Further, the CPU 10 executes the erase program 24 to control to erase the flash memory FLM.

The write program 20 includes a program operation control program which transfers a cell in the flash memory FLM from an erase state to a program state. The erase program 24 includes an erase operation control program which transfers a cell in the program state to the erase state.

Further, the controller 3 includes a diagnostic program 26, so that the CPU 1 executes the diagnostic program 26 to control diagnostic operation for the flash memory FLM. The diagnostic program 26 includes a program which controls the setting of a diagnostic parameter and a program which controls diagnostic operation, for example.

Further, although not illustrated in the drawings, the controller 3 performs the management of a defective block among a plurality of blocks in the flash memory FLM, the error correction of storage data, and so on.

Figure 3:
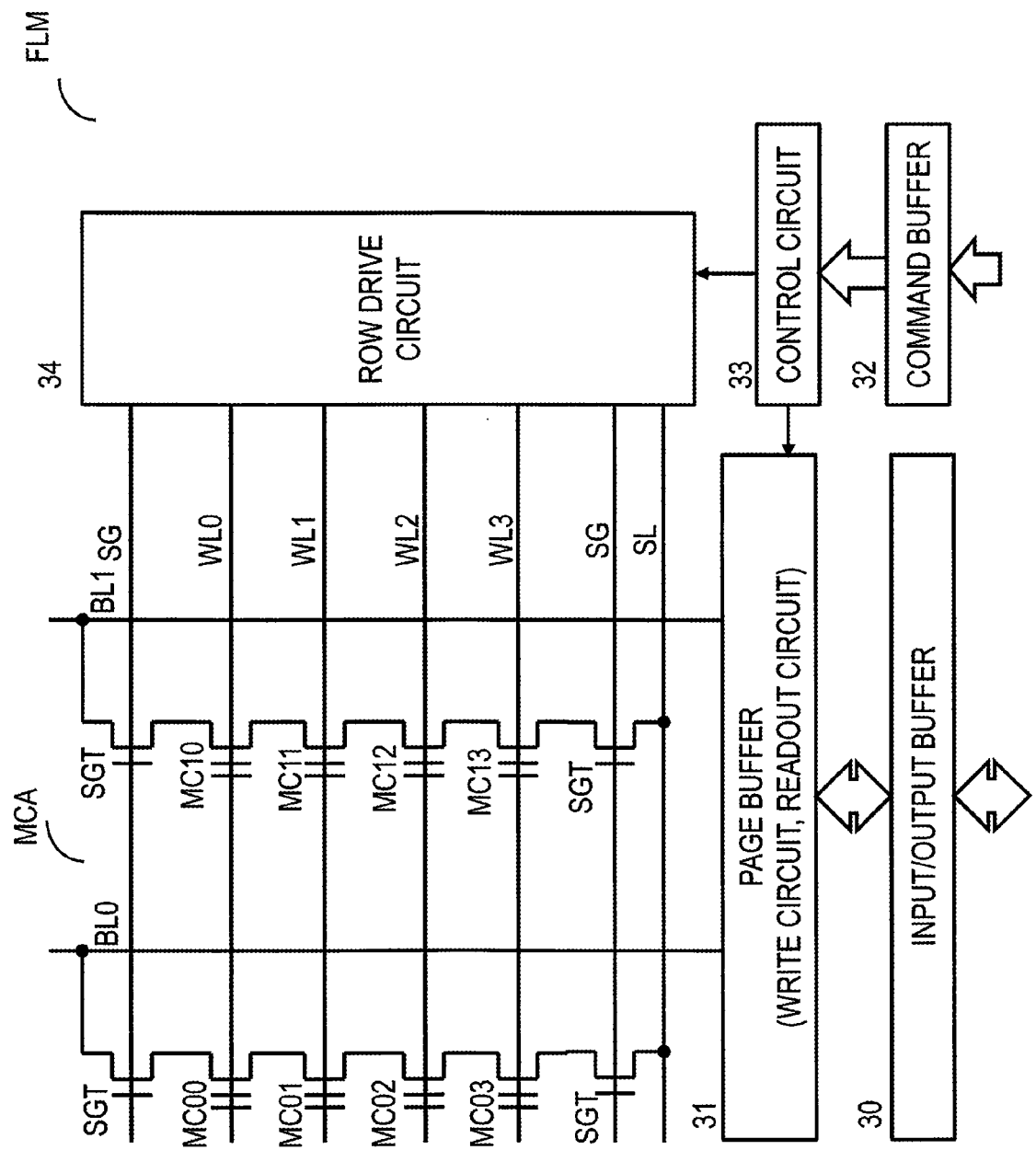
FIG. 3 is a diagram illustrating a configuration example of the flash memory.

FIG. 3 is a diagram illustrating a configuration example of the flash memory. The flash memory FLM is a memory device constituted by one chip and includes: a memory cell array MCA including memory cells MC00-MC13 arrayed in a matrix shape; an input/output buffer 30 which inputs write data and outputs readout data; a page buffer 31; a command buffer 32 to which a command is input; a control circuit 33 for controlling operation corresponding to the command; and a row drive circuit 34 which drives a word line WL, a select gate line SG and a source line SL in the memory cell array MCA.

The memory cell array MCA depicted in FIG. 3 is constituted by a NAND flash memory and includes, between each bit line BL0, BL1 and the source line SL, a select gate transistor SGT, a plurality of memory cells MC00-MC03, MC10-MC13 (four memory cells in the example of FIG. 3) connected in series and another select gate transistor SGT. The bit line BL0, BL1 is connected to the page buffer 31.

Each of the plurality of cell transistors MC00-MC03, MC10-MC13 between each pair of select gate transistors SGT is referred to as a string. Further, the memory cell array MCA of FIG. 3 corresponds to a memory block and two memory cells selected by each word line correspond to a page, for example.

Each memory cell transistor MC includes: a floating gate disposed on a semiconductor substrate between source and drain regions formed at the surface of the semiconductor substrate by the intermediary of a first insulating film; and a control gate disposed on the floating gate by the intermediary of a second insulating film. Each control gate is either connected to each word line WL or constituted by the word line.

Figure 4:
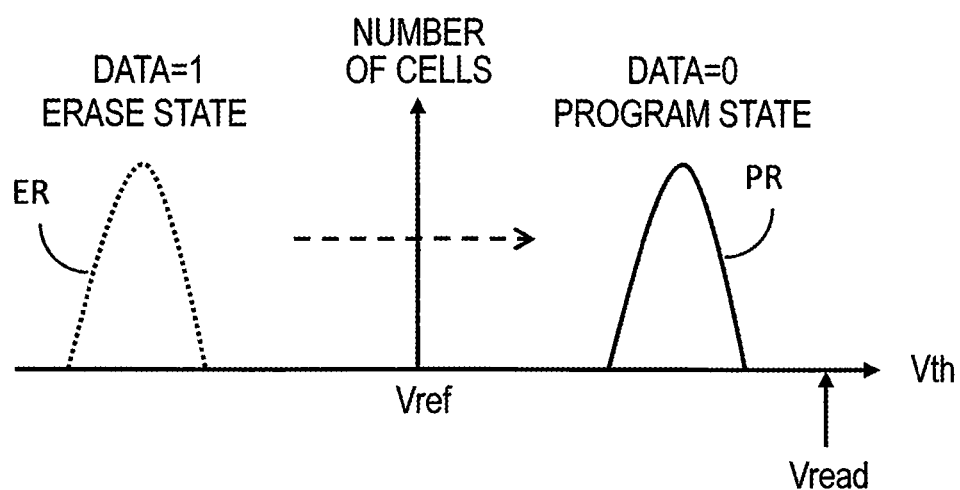
FIG. 4 is a diagram illustrating the erase state and the program state of memory cells in the flash memory.

FIG. 4 is a diagram illustrating the erase state and the program state of memory cells in the flash memory. The horizontal axis indicates a threshold voltage Vth of the cell transistor, whereas the vertical axis indicates the number of memory cells in the flash memory. A cell erase state ER is a state in which electrons are not injected into the floating gate, so that the threshold voltage of the cell transistor is lower than a readout reference voltage Vref. A cell group in the erase state ER is a set including threshold voltages within a fixed width. Also, a cell program state PR is a state in which electrons are injected into the floating gate, so that the threshold voltage of the cell transistor is higher than the readout reference voltage Vref. A cell group in the program state PR is also a set including threshold voltages within a fixed width.

In the erase state, data "1" is stored, for example, whereas in the program state, data "0" is stored, for example. Therefore, the write operation of the flash memory is a program operation in which, for a block including all memory cells in the erase state, a program pulse is applied to a memory cell whose write data is "0" to inject electrons into the floating gate, so as to transfer from the erase state to the program state. The program operation is executed to a page including a plurality of bits. Also, in the erase operation of the flash memory, an erasing voltage is applied to a memory cell in the program state to extract electrons in the floating gate, so as to transfer from the program state to the erase state. The erase operation is executed simultaneously on a block-by-block basis.

Further, in the readout operation of the flash memory, a readout reference voltage Vref is applied to the control gate of the memory cell, and it is detected whether the memory cell becomes conductive (on) or non-conductive (off). The readout operation is executed on a page-by-page basis, for example.

Here, the injection of electrons into the floating gate in the program operation is also referred to as electron charge. Also the extraction of electrons from the floating gate in the erase operation is also referred to as electron discharge.

Figure 5:
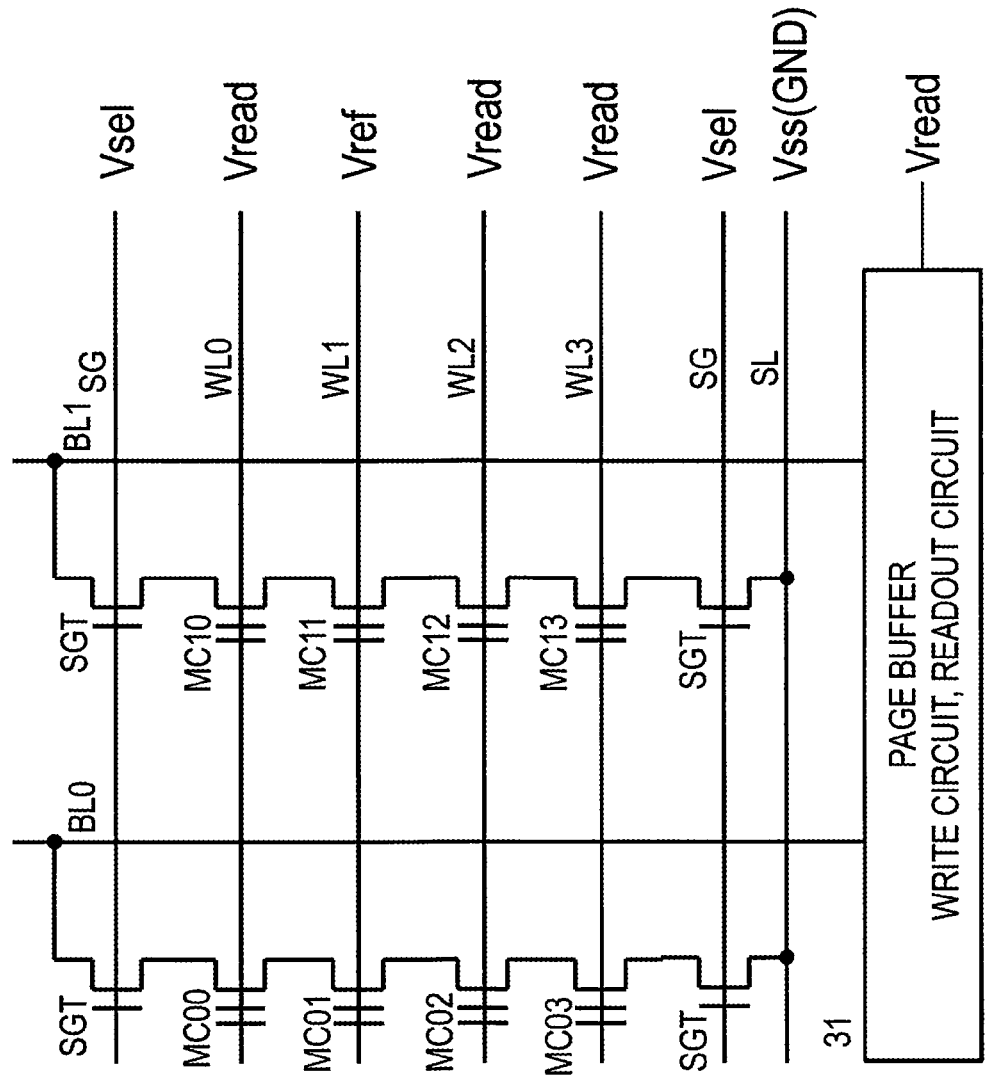
FIG. 5 is a diagram illustrating the readout operation of the flash memory.

FIG. 5 is a diagram illustrating the readout operation of the flash memory. In the readout operation, each bit line BL0, BL1 is set to a predetermined positive voltage, and a source line SL is set to a ground potential Vss. In the above state, the row drive circuit 34 depicted in FIG. 3 applies, to the select gate line SG connected to the gate of the select gate transistor SGT, a voltage Vsel to make the select gate transistor SGT conductive. By this, the cell transistor string MC00-MC03 is connected to the bit line BL0 and the source line SL, whereas the other cell transistor string MC10-MC13 is connected to the bit line BL1 and the source line SL. Then, the readout reference voltage Vref is applied to the word line WL1 of selected cell transistors MC01, MC11, whereas a voltage Vread higher than the threshold voltage for the program state is applied to the word lines WL0, WL2, WL3 of other non-selected cell transistors. The readout reference voltage Vref is, as depicted in FIG. 4, an intermediate voltage between the threshold voltages for the erase state ER and the program state PR, and is 0 V, for example. On the other hand, a voltage Vread for a non-selected cell is higher than the threshold voltage for the program state PR, and is 3.5 V, for example.

In the above-mentioned condition, the selected cell transistors MC01, MC11 become conductive if in the erase state, whereas become non-conductive if in the program state. On the other hand, all non-selected cell transistors become conductive. As a result, the potential of the bit lines BL0, BL1 is decreased if the selected cell transistors MC01, MC11 are in the erase state, whereas the potential of the bit lines BL0, BL1 is maintained to be an original positive voltage level if the selected cell transistors MC01, MC11 are in the program state. Accordingly, the readout circuit in the page buffer 31, by detecting whether the voltage of each bit line BL0, BL1 is high or low, reads out storage data in the selected cell transistors MC01, MC11.

Two memory cell strings sandwiched between two select gate transistors SGT depicted in FIG. 5 correspond to one memory block. Also, two memory cells selected by one word line WL correspond to one page. Therefore, in the example of FIG. 5, one page includes two memory cells, and 2-bit data in one page is read out by the selection of the word line WL1. Further, one block includes four pages.

With regard to a block in which all memory cells are in the erase state, a program pulse is applied between the control gate (word line WL) and the semiconductor substrate of a memory cell whose write data is "0". For example, a positive voltage is applied to the source line SL, a ground voltage is applied to the semiconductor substrate, and the select gate transistors SGT and non-selected transistors MC00, MC02, MC03 and MC10, MC12, MC13 are caused to be a conductive state. Then, a ground potential is applied to the bit line BL of the selected cell transistor whose write data is "0", and a positive voltage is applied to the bit line of the selected cell transistor whose write data is "1", respectively, and then, a positive program pulse is applied to the word line WL of the selected cell. By this, electrons which are produced between the source and the drain of the selected cell transistor whose write data is "0" are injected (or charged) into the floating gate. To the selected cell transistor whose write data is "1", no electron is injected, so that data "1" in the erase state is maintained.

Thus, similar to the readout operation, the write operation is performed on a page-by-page basis.

In the erase operation, after all memory cells in a block are transferred to the program state, an erase voltage of a reverse direction to the program pulse is applied between all word lines in the block and the semiconductor substrate, so that electrons in the floating gate are extracted to the semiconductor substrate side. The erase operation is performed on a block-by-block basis.

Figure 6:
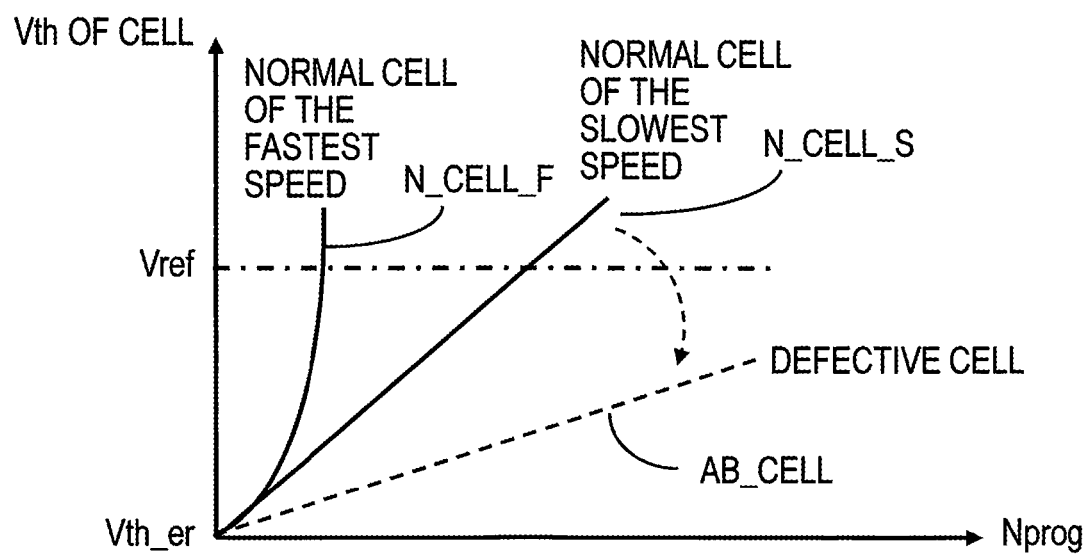
FIG. 6 is a diagram illustrating a charge characteristic of the flash memory caused by a program pulse.

FIG. 6 is a diagram illustrating a charge characteristic of the flash memory caused by a program pulse. The horizontal axis corresponds to a program pulse count Nprog, whereas the vertical axis corresponds to the threshold voltage Vth of the cell transistor. As described above, the program pulse is applied to the cell transistor, so that electrons are injected into the floating gate and the threshold voltage Vth of the cell transistor is increased. Or, to say in other words, the program pulse is applied to the cell transistor to thereby charge electrons into the floating gate and change a charge voltage between the control gate and the semiconductor substrate of the ground potential.

Here, a rate of change in the charge voltage to the program pulse count, or a rate of change in the threshold voltage of the cell transistor to the program pulse count is referred to as a charge speed or an electron injection speed.

As depicted in FIG. 6, a cell whose charge speed is faster has a faster increase speed of the threshold voltage Vth (of charge voltage) relative to the program pulse count, so that the threshold voltage Vth of the cell transistor exceeds the readout reference voltage Vref with a smaller program pulse count. On the other hand, a cell whose charge speed is slower has a slower increase speed of the threshold voltage Vth (or charge voltage) relative to the program pulse count, so that the threshold voltage Vth of the cell transistor does not exceed the readout reference voltage Vref unless pulses of a larger program pulse count are applied.

In FIG. 6, a charge characteristic N_CELL_F of a normal cell whose charge speed is the fastest changes along like a quadratic curve, for example. Also, a charge characteristic N_CELL_S of a normal cell whose charge speed is the slowest changes along substantially a linear straight line, for example, and moreover, the charge speed or the electron injection speed is slow.

The flash memory is examined through a test at factory shipment that the charge speed of all memory cells is within a desired range. Therefore, among the memory cells in the flash memory after the shipment, both the charge characteristic N_CELL_F whose charge speed is the fastest and the charge characteristic N_CELL_S whose charge speed is the slowest are within the desired range.

However, by the repetition of the program operation and the erase operation at the use state of the flash memory, the insulating film between the semiconductor substrate and the floating gate is deteriorated and the charge speed is decreased, so that the flash memory comes to a defective mode. In FIG. 6, a defective cell includes a decreased charge speed of the charge characteristic AB_CELL, whose charge speed is slower than the charge characteristic N_CELL_S of a normal cell of the slowest speed.

[Embodiment of the Present Invention]

According to the present embodiment, a flash memory in a use state is diagnosed to detect a defective cell whose charge speed is less than the charge characteristic N_CELL_S of a normal cell whose charge speed is the slowest. Here, since the flash memory is in the use state, it is necessary to diagnose a block, in which data is already stored, while maintaining the stored data.

Figure 7:
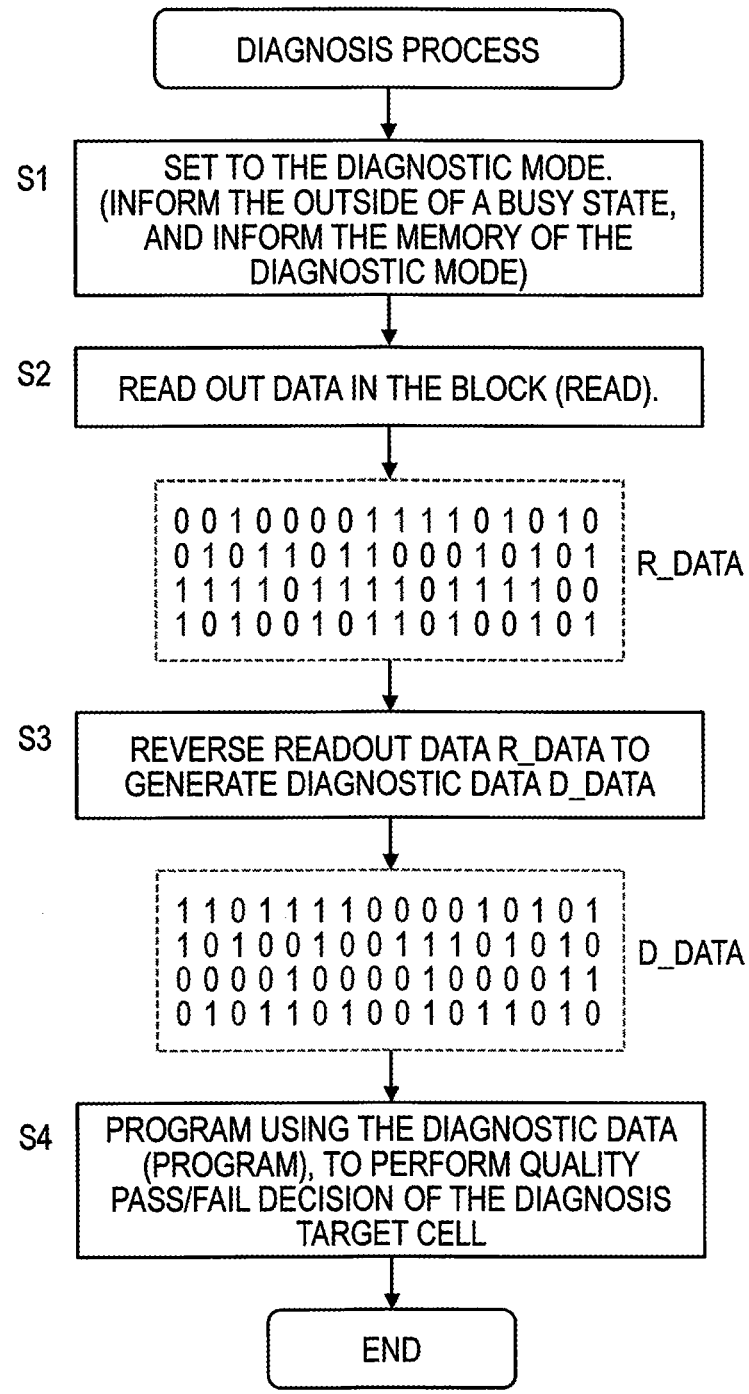
FIG. 7 is a diagnostic process for the flash memory according to the present embodiment.

FIG. 7 is a diagnostic process for the flash memory according to the present embodiment. The diagnostic process is controlled by a controller of a storage apparatus in which the flash memory is incorporated. The controller 3, in response to a diagnostic request etc. from the outside, enters a diagnostic mode (S1). The controller 3 may spontaneously enter the diagnostic mode at preset timing of predetermined intervals. In the diagnostic mode, the controller 3 responses a busy state to an access from the outside of the memory apparatus, and informs the incorporated flash memory of the diagnostic mode (S1).

Next, the controller 3 issues a read command to the flash memory FLM, so that data R_DATA in a diagnostic target block is read out (S2). Here, the data is already stored in the diagnostic target block. Then, the controller 3 temporally stores the readout data R_DATA into the cache memory 4. Further, the controller 3 reverses the readout data R_DATA to generate diagnostic data D_DATA (S3). By the above reverse, "1" in the readout data R_DATA, that is the already stored data, is shifted to "0" in the diagnostic data D_DATA.

The data R_DATA and the diagnostic data D_DATA depicted in FIG. 7 include 4-row, 16-column data, in which 1-row, 16-bit data corresponds to a page. Therefore, each one block data R_DATA and D_DATA of FIG. 7 includes 4-page data, and one page includes 16 bits.

The controller 3 then issues a diagnostic program command to the flash memory FLM and supplies the diagnostic data D_DATA as write data, to cause the flash memory to program the diagnostic data and make a quality pass/fail decision of the diagnostic target cell (S4). As described earlier, in the ordinary program operation of the flash memory, a program pulse is applied to a memory cell whose write data is "0". On the other hand, in the diagnostic mode, the controller supplies, as write data, the diagnostic data D_DATA obtained by reversing the readout data, to the flash memory. Therefore, in the program operation in the diagnostic mode (hereafter referred to as diagnostic program operation), a program pulse is applied only to a memory cell in the erase state (in which readout data is "1" and diagnostic data is "0").

Further, in the diagnostic program operation in the diagnostic mode, a program pulse is applied within a range of the memory cell in the erase state not transferring to the program state. This prevents the memory cell of data "1" from transferring to the state of data "0" caused by the diagnostic program operation in the diagnostic mode, so that the write data "1" in the memory diagnostic target memory cell is maintained. In other words, the diagnostic operation according to the present embodiment checks the charge characteristic of the memory cell in the erase state without any transfer of data already stored in the block, so as to check a deteriorated state of the memory cell in the block. The program operation in the diagnostic mode will be described later in detail.

Figure 8:
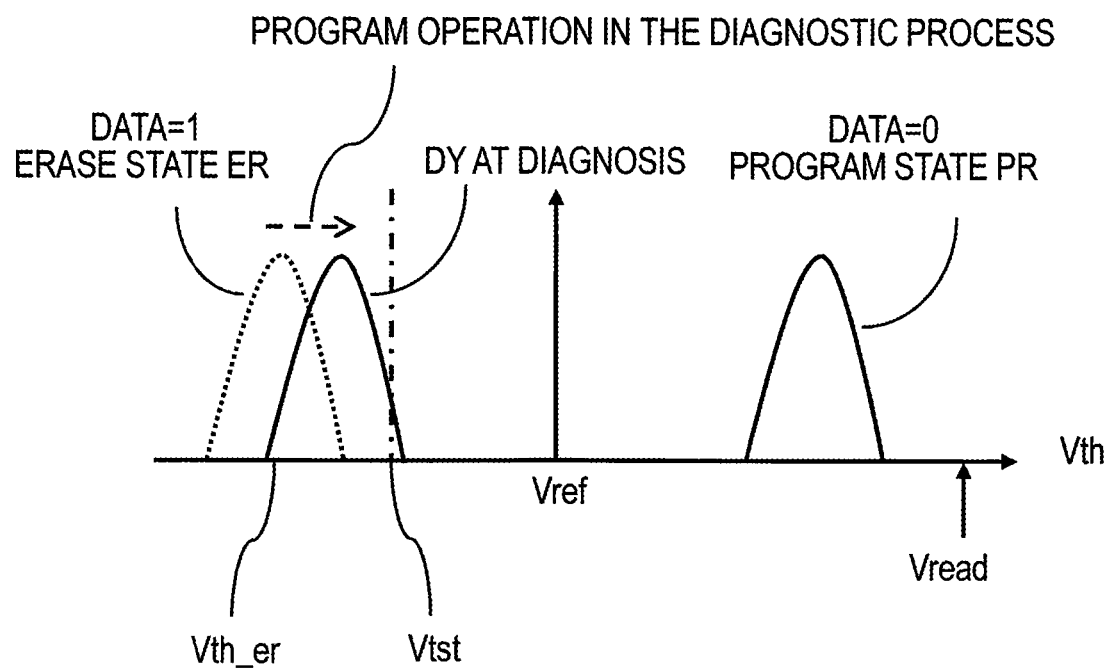
FIG. 8 is a diagram illustrating a diagnostic process according to the present embodiment.

FIG. 8 is a diagram illustrating a diagnostic process according to the present embodiment. In FIG. 8, similar to FIG. 4, the horizontal axis indicates the threshold voltage Vth of the cell transistor, whereas the vertical axis indicates the number of cells. In the diagnostic process, a program pulse is applied to the cell transistor in the erase state to increase the threshold voltage thereof. This point is similar to the program operation depicted in FIG. 4. However, in the diagnostic process, the program pulse is applied in such a range that the threshold voltage of the cell transistor in the erase state does not exceed the readout reference voltage Vref. For example, whenever the program pulse is applied, the threshold voltage of the diagnostic target cell is checked to confirm whether or not the threshold voltage thereof reaches a diagnostic reference voltage Vtst lower than the readout reference voltage Vref. Alternatively, there is measured in advance a program pulse count by which the cell whose charge speed is the fastest reaches the diagnostic reference voltage Vtst. Then, in the diagnostic process, a program pulse is applied to the diagnostic target cell in such a manner that a program pulse count does not exceed the above measured program pulse count, so as to measure the charge speed of the diagnostic target cell.

Figure 9:
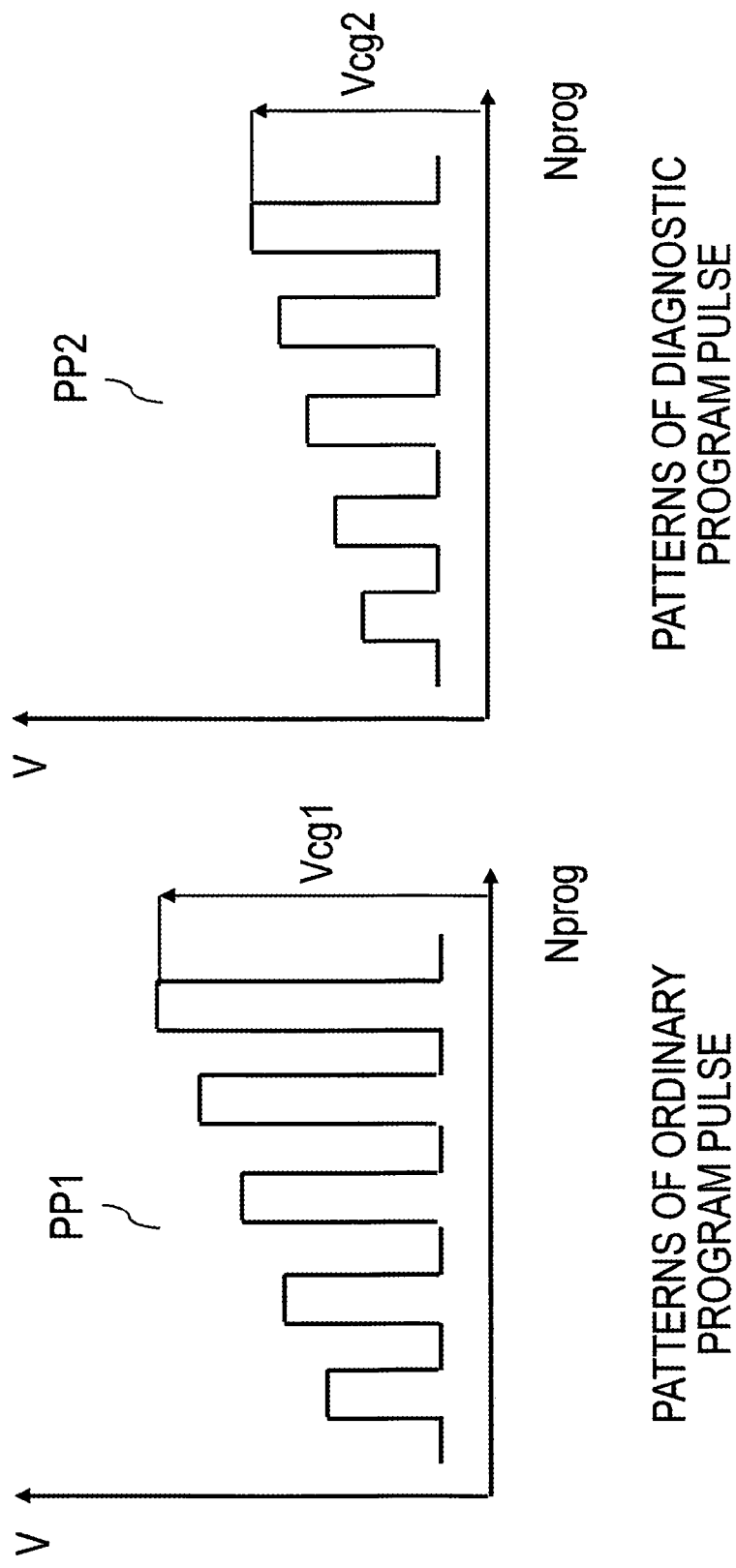
FIG. 9 is a diagram illustrating exemplary patterns of an ordinary program pulse and a diagnostic program pulse.

FIG. 9 is a diagram illustrating exemplary patterns of an ordinary program pulse and a diagnostic program pulse. In a pattern PP1 of the ordinary program pulse, a pulse voltage Vcg1 increases as the pulse count increases. The reason is that when the program pulse is applied and electrons are injected (or charged) to the floating gate, the potential of the floating gate is decreased, causing the electrons hard to be injected. To cope with the above problem, the voltage Vcg1 of the program pulse thereafter is increased, so that a voltage between the semiconductor substrate and the floating gate is increased to a magnitude sufficient for electron injection.

In a similar manner, in a pattern PP2 of a diagnostic program pulse, a pulse voltage increases as the pulse count increases. However, a voltage Vcg2 of each pulse is lower than the voltage Vcg1 of the ordinary program pulse. Therefore, in the case of the diagnostic program pulse, the number of electrons injected into the floating gate by the application of one pulse is smaller, as compared to the case of the ordinary program pulse.

By the use of the diagnostic program pulse, the charge speed (charge voltage per pulse or an increase rate of the threshold voltage) of the cell in the diagnostic operation can be decreased as compared to the case of the ordinary program operation. As a result, the diagnostic target memory cell can securely be controlled in a manner not to exceed the readout reference voltage Vref.

According to the present embodiment, cell diagnosis is performed using the diagnostic program pulse. However, it may also be possible to perform diagnosis using the ordinary program pulse.

[First Embodiment]

Figure 10:
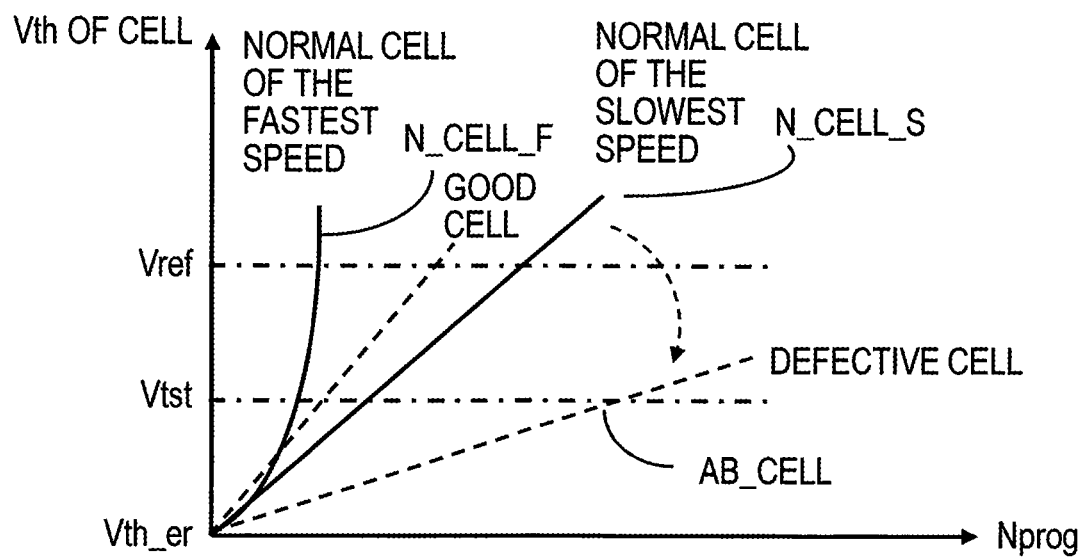
FIG. 10 is a diagram illustrating a diagnostic method according to a first embodiment.

FIG. 10 is a diagram illustrating a diagnostic method according to a first embodiment. In FIG. 10, the horizontal axis indicates a diagnostic program pulse count Nprog, whereas the vertical axis indicates the threshold voltage Vth (or charge voltage) of a cell transistor. At factory shipment, each data of, or data related to, the charge characteristic N_CELL_F of a normal cell whose charge speed is the fastest (that is, the pulse count is the smallest) and the charge characteristic N_CELL_S of a normal cell whose charge speed is the slowest among normal cells is stored in the flash memory.

In the diagnostic process, a diagnostic program pulse is applied to the diagnostic target cell in such a range that the threshold voltage Vth of the diagnostic target cell does not exceed the diagnostic reference voltage Vtst which is lower than the readout reference voltage Vref. Then, if the charge speed of the diagnostic target memory cell is faster than or equal to the charge speed of the normal cell of the slowest speed whose charge characteristic is N_CELL_S, the diagnostic target cell is determined to be a normal cell, whereas if slower, the diagnostic target cell is determined to be a defective cell.

For example, the controller 3 controls the flash memory to execute reading out based on the diagnostic reference voltage Vtst whenever applying the diagnostic program pulse thereto, to output diagnostic readout data. Then, the controller 3 detects a charge speed according to a pulse count when it is detected based on the diagnostic readout data that the threshold voltage Vth of the diagnostic target cell reaches the diagnostic reference voltage Vtst, and decides whether or not the charge speed of the diagnostic target cell is faster than or equal to the charge speed of the normal cell whose charge speed is the slowest. The decision operation of the diagnostic process will be described later in detail.

Figure 11:
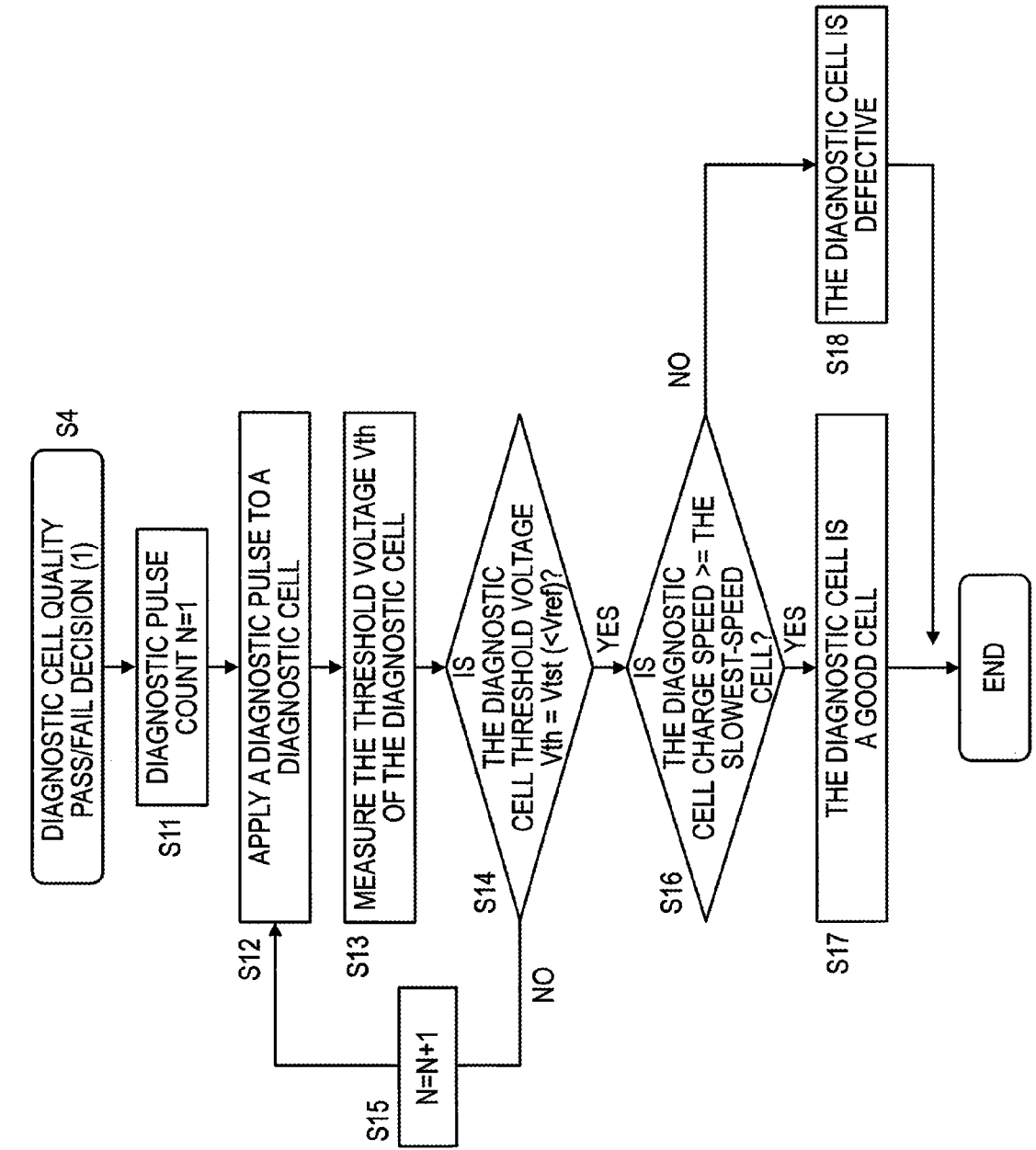
FIG. 11 is a flowchart of an example of the quality pass/fail decision of the diagnostic target cell according to the first embodiment.

FIG. 11 is a flowchart of an example of the quality pass/fail decision of the diagnostic target cell according to the first embodiment. The flowchart may be executed mainly by the controller 3 or by the control circuit 33 in the flash memory.

As a premise when the diagnosis is started, the threshold voltage Vth of the diagnostic target cell in the erase state in a diagnostic target block is set to be a threshold voltage of a fixed narrow range through an erase verification process. The threshold voltage in the erase state is defined to be a Vth_er (refer to FIG. 10).

The controller 3 or the control circuit 33 sets a diagnostic pulse count N to be an initial value N=1 (S11), and applies one diagnostic program pulse to the diagnostic target cell (S12) to measure the threshold voltage Vth of the diagnostic target cell (S13). The above measurement of the threshold voltage Vth is virtually equivalent to the measurement of the charge voltage. Then, the controller 3 or the control circuit 33 checks whether or not the threshold voltage Vth of the diagnostic target cell reaches the diagnostic reference voltage Vtst (S14). The above check can be executed based on readout data using the diagnostic reference voltage Vtst as a readout reference voltage. More specifically, by the execution of diagnostic readout operation in which the diagnostic reference voltage Vtst is applied to the word line of the diagnostic target cell and whether or not the diagnostic target cell conducts is checked by the potential of the bit line, the check can be made based on the readout data.

If the threshold voltage Vth of the diagnostic target cell does not yet reach the diagnostic reference voltage Vtst (NO in S14), the diagnostic pulse count is incremented (N=N+1) (S15), so that steps S12, S13, S14 are repeated until the threshold voltage Vth of the diagnostic target cell reaches the diagnostic reference voltage Vtst (NO in S14).

When the threshold voltage Vth of the diagnostic target cell reaches the diagnostic reference voltage Vtst (YES in S14), the control circuit 33 or the controller 3 checks whether or not the charge speed of the diagnostic target cell (Vtst−Vth_er)/N is faster than or equal to the charge speed N_CELL_S of the normal cell whose charge speed is the slowest (S16). The control circuit 33 or the controller 3 determines the diagnostic target cell to be a good cell if the charge speed of the diagnostic target cell is faster than or equal to the charge speed of the normal cell of the slowest speed (S17), whereas determines to be a defective cell if the charge speed is slower (S18).

When the controller 3 executes the diagnostic process depicted in FIG. 11, the controller 3 inputs a diagnostic program command into the flash memory FLM together with one-page diagnostic data. In response thereto, the control circuit 33 of the flash memory FLM applies a diagnostic program pulse to the diagnostic target cell (cell in which readout data is "1" and diagnostic data is "0") of the erase state in a diagnostic target page. Thereafter, the controller 3 executes the diagnostic readout of the diagnostic target page. In response to a diagnostic readout request of the diagnostic target page, the flash memory FLM sets the readout reference voltage to the diagnostic reference voltage Vtst to read out the diagnostic target page. Based on the pulse count at a time point when the readout data of the diagnostic target cell among the readout data is reversed from "1" to "0", the controller 3 checks whether or not the charge speed of the diagnostic target cell is faster than or equal to the charge speed of the normal cell of the slowest speed.

When the control circuit 33 in the flash memory FLM executes the diagnostic process depicted in FIG. 11, the controller inputs to the flash memory FLM a diagnostic program command together with one-page diagnostic data. In response thereto, the control circuit 33 in the flash memory FLM executes the diagnostic process depicted in FIG. 11, to output a diagnostic result of either the diagnostic target cell with the diagnostic program pulse being applied is a good product or a defective product.

[Second Embodiment]

Figure 12:
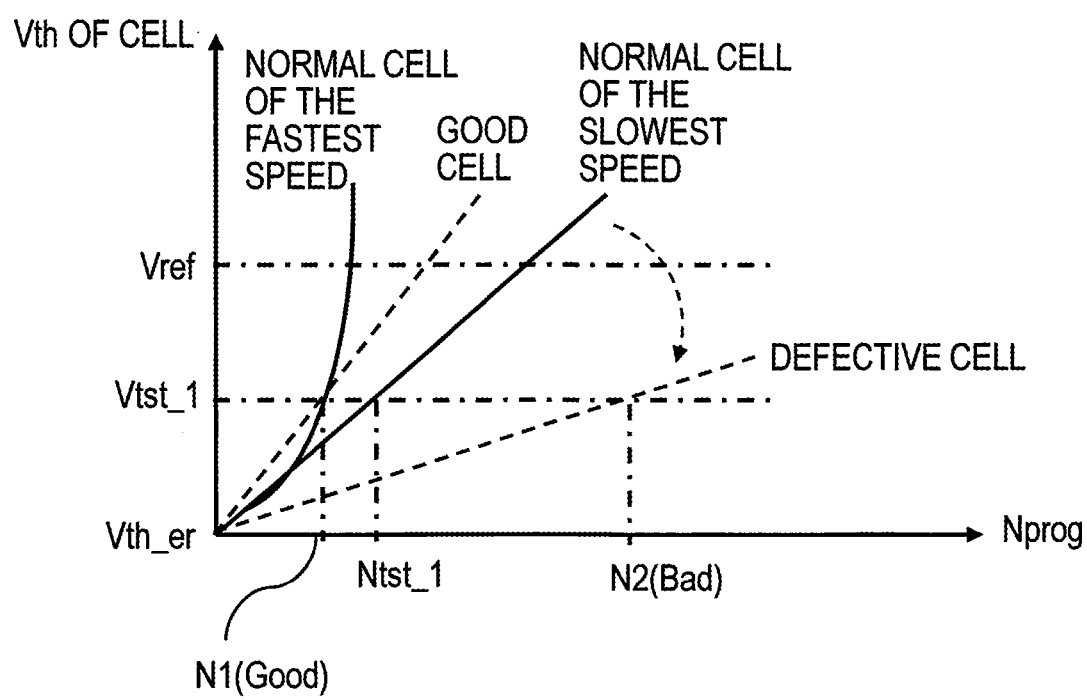
FIG. 12 is a diagram illustrating a diagnostic method according to a second embodiment.

FIG. 12 is a diagram illustrating a diagnostic method according to a second embodiment. Similar to FIG. 10, in FIG. 12, the horizontal axis indicates the diagnostic program pulse count Nprog, whereas the vertical axis indicates the threshold voltage Vth (or charge voltage) of a cell.

At the factory shipment of a flash memory, there is examined a diagnostic reference pulse count Ntst_1 which is necessary for the normal cell whose charge speed is the slowest to reach a diagnostic reference voltage Vtst_1, and the above data Ntst_1 is stored in a storage area. The diagnostic reference voltage Vtst_1 is sufficiently lower than the readout reference voltage Vref, whereas higher than the threshold voltage Vth_er of a cell in the erase state.

In the diagnostic process, the controller 3 or the control circuit 33 of the flash memory checks, whenever applying one diagnostic program pulse to the diagnostic target cell, whether or not the threshold voltage Vth of the diagnostic target cell exceeds the diagnostic reference voltage Vtst_1. Then, the controller 3 or the control circuit 33 of the flash memory decides whether or not a pulse count N1 or N2 when the threshold voltage of the diagnostic target cell exceeds the diagnostic reference voltage Vtst_1 is smaller than or equal to the diagnostic reference pulse count Ntst_1. Because the pulse count N1 in FIG. 12 is smaller than the diagnostic reference pulse count Ntst_1, the diagnostic target cell of concern is determined to be a good product. On the other hand, because the pulse count N2 exceeds the diagnostic reference pulse count Ntst_1, the diagnostic target cell of concern is determined to be a defective product.

The above decision is equivalent to such a decision that the diagnostic target cell is a normal cell if the charge speed thereof is faster than or equal to the charge speed of the normal cell N_CELL_S of the slowest speed, whereas the diagnostic target cell is a defective cell if the charge speed thereof is slower. Namely, in the case the pulse count is N1, the charge speed of the diagnostic target cell is faster than or equal to the charge speed of the normal cell of the slowest speed, whereas in the case the pulse count is N2, the charge speed of the diagnostic target cell is slower than the charge speed of the normal cell of the slowest speed.

Figure 13:
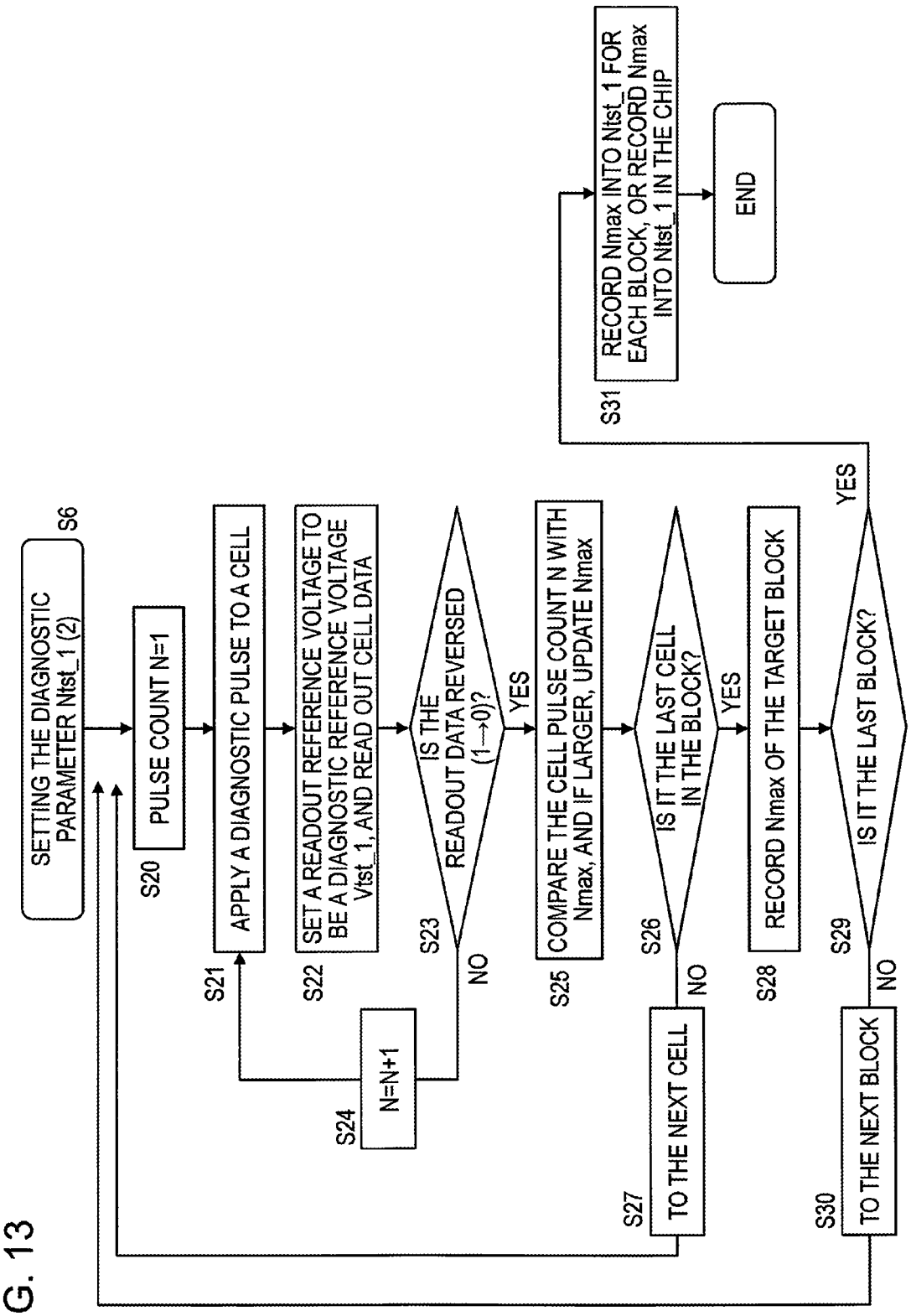
FIG. 13 is a flowchart of the setting process of the diagnostic parameter $Ntst\_1$ in the second embodiment.

FIG. 13 is a flowchart of the setting process of the diagnostic parameter Ntst_1 in the second embodiment. To execute diagnosis according to the present embodiment, at factory shipment, the diagnostic parameter Ntst_1 is detected and stored into the storage area of the flash memory FLM. Also, the information of the diagnostic program pulse is also stored.

The diagnostic parameter setting process is executed by a test apparatus. The test apparatus sets the diagnostic parameter for a block in which all cells are in the erase state. First, the test apparatus sets the pulse count N to be an initial value N=1 (S20), and whenever applying a diagnostic program pulse to a cell in the block of the flash memory (S21), reads out cell data through diagnostic readout in which the readout reference voltage is replaced by the diagnostic reference voltage Vtst (S22). Then, the test apparatus checks whether or not the readout data is reversed from "1" to "0" (S23). If the readout data is not reversed (NO in S23), the test apparatus sets N=N+1 (S24), and repeats steps S21-S23 until the readout data is reversed from "1" to "0". The above steps S21-S24 are executed according to a diagnostic program command with all write data to be "0" in a page of the block. The repetition is carried out until a plurality of cells in the page are all reversed to data "0", and a pulse count N applied before the reverse of readout data is recorded cell-by-cell.

Then, the test apparatus compares the pulse count N of the cell with a maximum number Nmax which is preset as an initial value, and if the pulse count N is larger than the maximum number Nmax, updates the maximum number Nmax with the detected pulse count N (S25). The test apparatus executes the above steps for all cells in the block (S26, S27), and repeats until detecting a pulse count by which the readout data of all cells in the target block are reversed from "1" to "0". After checking all cells in the block, the test apparatus records the maximum number Nmax of the target block (S28).

Further, the test apparatus repeats for all blocks in the flash memory (S29, S30). Finally, the test apparatus records each maximum number Nmax as each diagnostic reference pulse count Ntst_1, on a block-by-block basis (S31). Alternatively, the test apparatus records a maximum number Nmax in the whole flash memory to be the diagnostic reference pulse count Ntst_1 (S31).

Figure 14:
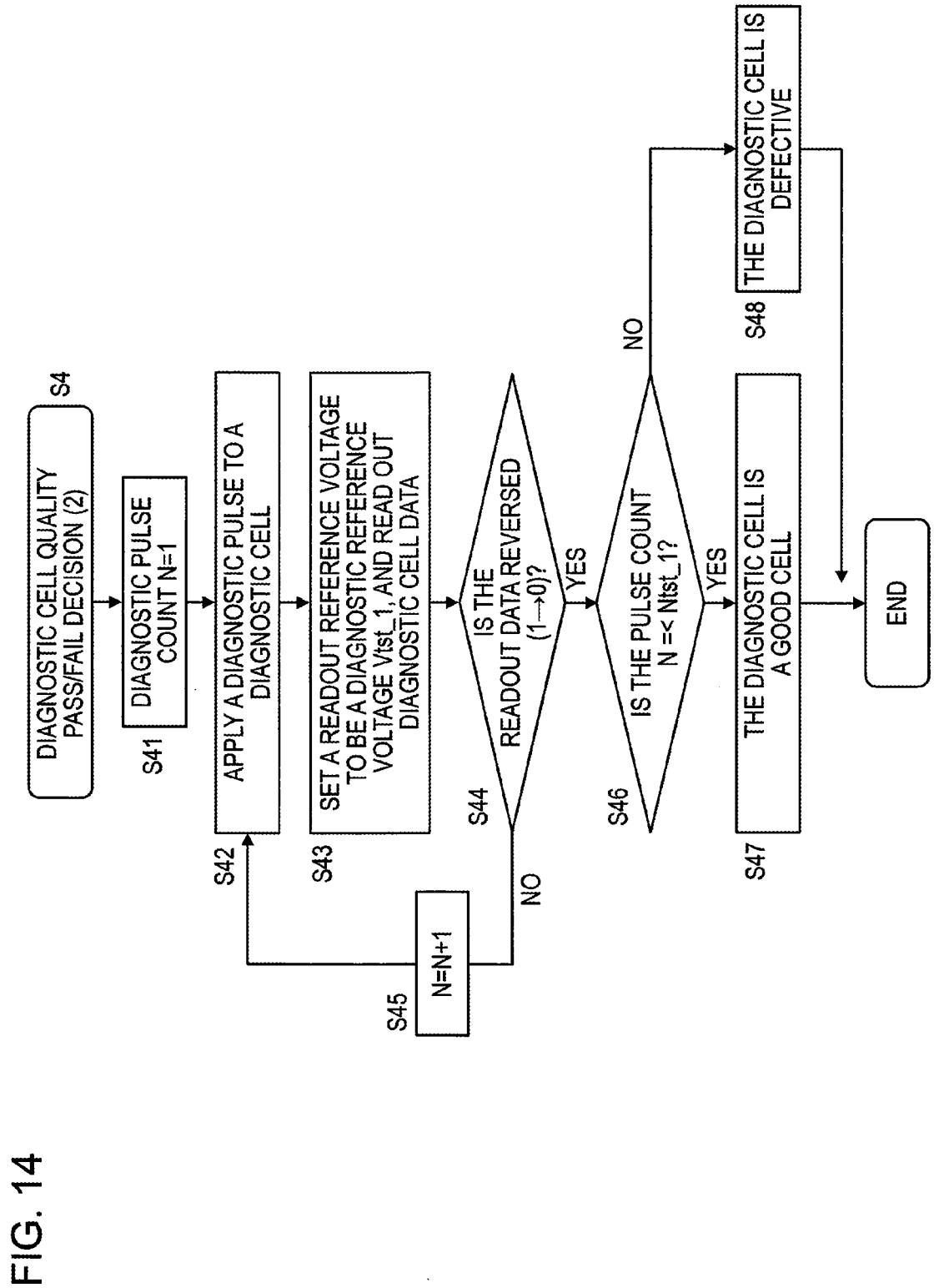
FIG. 14 is a flowchart of an example of the quality pass/fail decision of the diagnostic target cell according to the second embodiment.

FIG. 14 is a flowchart of an example of the quality pass/fail decision of the diagnostic target cell according to the second embodiment. The quality pass/fail decision of the diagnostic target cell in FIG. 14 is also executed by the controller 3 or the control circuit 33 of the flash memory. For simplicity, the following description will be given on assumption that the execution is made by the controller 3.

As a premise when the diagnosis is started, the threshold voltage Vth of the diagnostic target cell in the erase state in a diagnostic target block is set to be a threshold voltage in a fixed narrow range through an erase verification process. The threshold voltage in the erase state is defined to be a Vth_er.

The controller 3 sets the diagnostic pulse count N to be an initial value N=1 (S41), applies one diagnostic program pulse to the diagnostic target cell (S42), and performs diagnostic readout, in which the readout reference voltage Vref is replaced by the diagnostic reference voltage Vtst_1, to read out data in the diagnostic cell (S43). The controller 3 then checks whether or not the readout data of the diagnostic target cell is reversed from "1" to "0" (S44). The above application of the diagnostic program pulse and the readout of data in the diagnostic cell are performed in the following manner, for example. Namely, the controller 3 inputs to the flash memory a diagnostic program command together with one-page diagnostic data, to cause the flash memory to apply the diagnostic program pulse, and thereafter, the controller 3 inputs a diagnostic read command to cause the flash memory to output the diagnostic readout data thereof.

When the diagnostic readout data of the diagnostic target cell is not yet reversed to data "0" (NO in S44), the controller 3 increments the diagnostic pulse count (N=N+1) (S45), so as to repeat steps S42, S43, S44 until the diagnostic readout data of the diagnostic target cell is reversed to data "0" (YES in S44).

When the diagnostic readout data of the diagnostic target cell is reversed to data "0" (NO in S44), the controller 3 checks for each diagnostic target cell whether or not a pulse count N when the data is reversed to "0" is smaller than or equal to the diagnostic reference pulse count Ntst_1 (S46). The controller 3 determines the diagnostic target cell to be a good cell if the pulse count N is smaller than or equal to the diagnostic reference pulse count Ntst_1 (S47), whereas determines to be a defective cell if the pulse count N exceeds the diagnostic reference pulse count Ntst_1 (S48).

Also in the case the control circuit 33 in the flash memory FLM executes the diagnostic process as depicted in FIG. 14, the controller inputs a diagnostic program command to the flash memory FLM together with one-page diagnostic data, similar to the description given by reference to FIG. 11. In response thereto, the control circuit 33 in the flash memory FLM executes the diagnostic process as depicted in FIG. 14, to output a diagnostic result whether the diagnostic target cell is a good product or a defective product.

[Third Embodiment]

Figure 15:
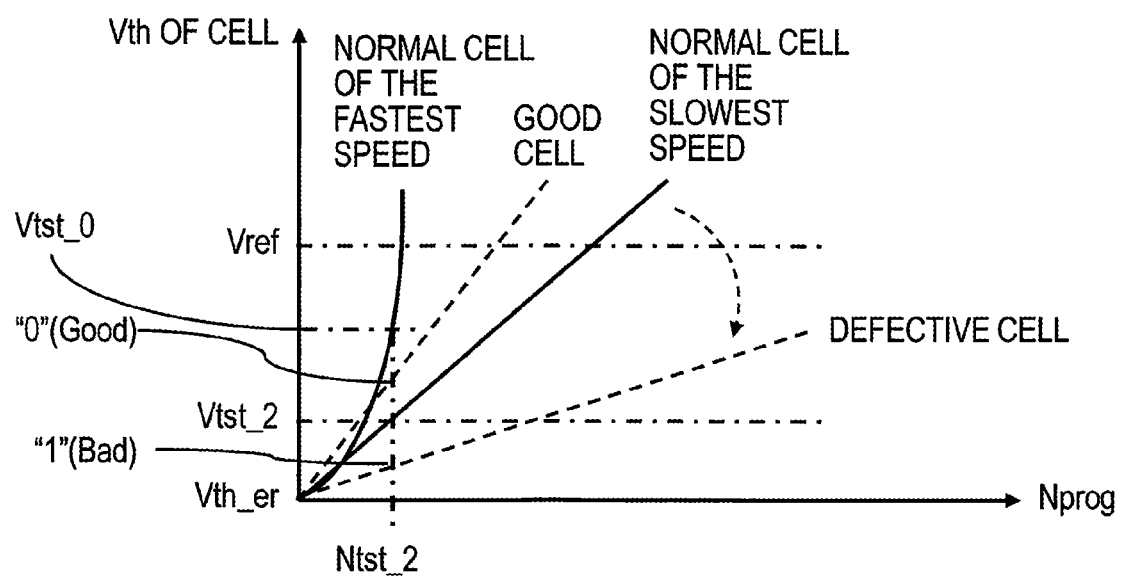
FIG. 15 is a diagram illustrating a diagnostic method according to a third embodiment.

FIG. 15 is a diagram illustrating a diagnostic method according to a third embodiment. In FIG. 15, similar to FIGS. 10 and 12, the horizontal axis indicates the diagnostic program pulse count Nprog, whereas the vertical axis indicates the cell threshold voltage Vth.

At the factory shipment of a flash memory, there are examined a diagnostic reference pulse count Ntst_2 by which a normal cell whose charge speed is the fastest reaches a voltage Vtst_0 which is sufficiently lower than the readout reference voltage Vref, and a diagnostic reference voltage Vtst_2 which the threshold voltage Vth reaches when the diagnostic reference pulse count Ntst_2 is applied to a normal cell whose charge speed is the slowest. The data of the above diagnostic reference pulse count Ntst_2 and the diagnostic reference voltage Vtst_2 are stored in a storage area. Here, the voltage Vtst_0 and the diagnostic reference voltage Vtst_2 are sufficiently lower than the readout reference voltage Vref, whereas higher than the threshold voltage Vth of a cell in the erase state.

In the diagnostic process, the controller 3 or the control circuit 33 of the flash memory applies diagnostic program pulses with the diagnostic reference pulse count Ntst_2, and checks whether or not the threshold voltage Vth of the diagnostic target cell is larger than or equal to the diagnostic reference voltage Vtst_2. The check whether or not the threshold voltage Vth of the diagnostic target cell is larger than or equal to the diagnostic reference voltage Vtst_2 is performed by checking data read out in diagnostic readout in which the readout reference voltage is replaced by the diagnostic reference voltage Vtst_2. The controller 3 or the control circuit 33 determines to be a good product if the diagnostic readout data is "0", whereas a defective product if the readout data is "1".

The above decision is equivalent to a decision that the diagnostic target cell is a normal cell if the charge speed thereof is faster than or equal to the charge speed of the normal cell of the slowest speed whose charge characteristic is N_CELL_S, whereas the diagnostic target cell is a defective cell if the charge speed thereof is slower. In other words, if the threshold voltage Vth of the diagnostic target cell when pulses equal in number to the diagnostic reference pulse count Ntst_2 are applied to the examination target cell is larger than or equal to the diagnostic reference voltage Vtst_2, the charge speed of the diagnostic target cell is faster than or equal to the charge speed of the normal cell of the slowest speed, whereas if the threshold voltage Vth is smaller, the charge speed of the diagnostic target cell is slower.

Moreover, in the diagnostic process according to the third embodiment, after diagnostic pulses with the diagnostic reference pulse count Ntst_2 are continuously applied to the diagnostic target cell, it is determined if the diagnostic cell is a good cell or a defective cell dependent on whether data output in the diagnostic readout, in which the readout reference voltage is set to be the diagnostic reference voltage Vtst_2, is "0" or "1". Also, even if the diagnostic target cell has the fastest charge speed, stored data "1" is not reversed by the application of pulses equal in number to the diagnostic reference pulse count Ntst_2.

Figure 16:
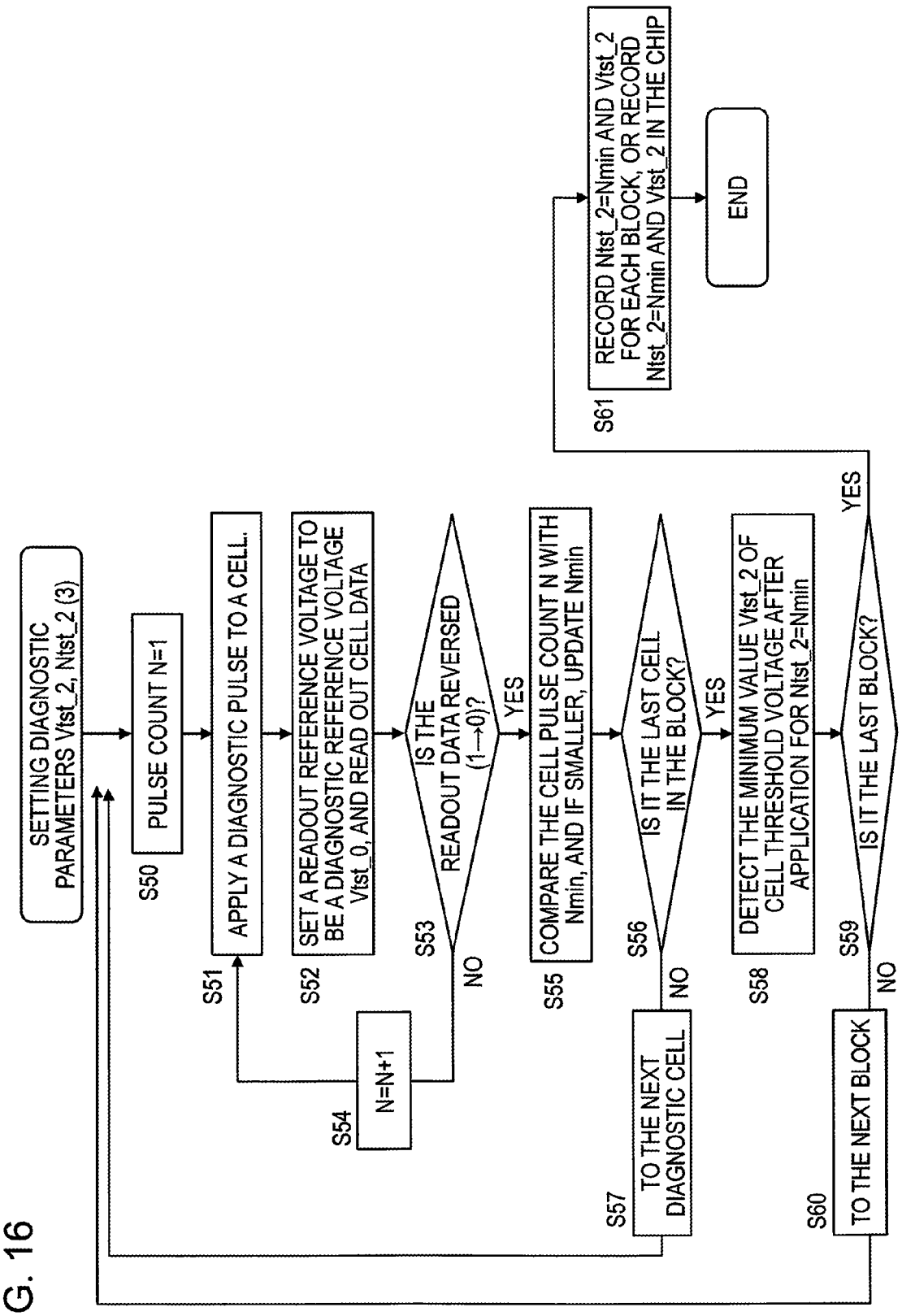
FIG. 16 is a flowchart in the setting process of the diagnostic parameters $Vtst\_2$ and $Ntst\_2$ according to the third embodiment.

FIG. 16 is a flowchart in the setting process of the diagnostic parameters Vtst_2 and Ntst_2 according to the third embodiment. In order to execute diagnosis according to the present embodiment, the diagnostic parameters Vtst_2, Ntst_2 are detected and stored in a storage area of the flash memory FLM at the factory shipment. Further, the information of the diagnostic program pulse is also stored.

The diagnostic parameter setting process is executed by a test apparatus. The test apparatus sets diagnostic parameters for each block in which all cells are in the erase state. First, the test apparatus sets the pulse count N to be an initial value N=1 (S50), and whenever applying a diagnostic program pulse to the cell in the block of the flash memory (S51), the test apparatus reads out cell data through diagnostic readout in which the readout reference voltage is replaced by the diagnostic reference voltage Vtst_0 (S52), to check whether or not the readout data is reversed from "1" to "0" (S53). If no reverse is made (NO in S3), the test apparatus sets N=N+1 (S54), and repeats steps S51-S53 until the readout data is reversed from "1" to "0". The above repetition is carried out until a plurality of cells in the page are all reversed to data "0", and the pulse count N of pulses applied before the reverse is made is detected cell-by-cell.

Then, the test apparatus compares the pulse count N of each cell with a minimum number Nmin which is preset as an initial value. If the pulse count N is smaller than the minimum number Nmin, the test apparatus updates the minimum number Nmin by the detected pulse count N (S55). The test apparatus executes the above process for all cells in the block (S56, S57) to repeat until detecting the pulse count by which the readout data of all cells in the target block are reversed from "1" to "0".

The test apparatus, when all cells in the block are checked (YES in S56), applies pulses with the diagnostic reference pulse count Ntst_2=Nmin to all cells in the block, to detect a minimum value Vtst_2 among threshold voltages of all cells (S58). The measurement of the minimum threshold voltage of all cells is executed by repeating readout operation for all cells while changing the readout reference voltage, and by detecting a readout reference voltage when the readout data is reversed for the first time.

Further, the test apparatus repeats for all blocks in the flash memory (S59, S60). Finally, the test apparatus records, for each block, the minimum number Nmin to be the diagnostic reference pulse count Ntst_2, and the minimum threshold voltage to be the diagnostic reference voltage Vtst_2, respectively (S61). Alternatively, the test apparatus records the minimum number Nmin in the flash memory to be the diagnostic reference pulse count Ntst_2, and the minimum threshold voltage in the flash memory to be the diagnostic reference voltage Vtst_2, respectively (S61).

Figure 17:
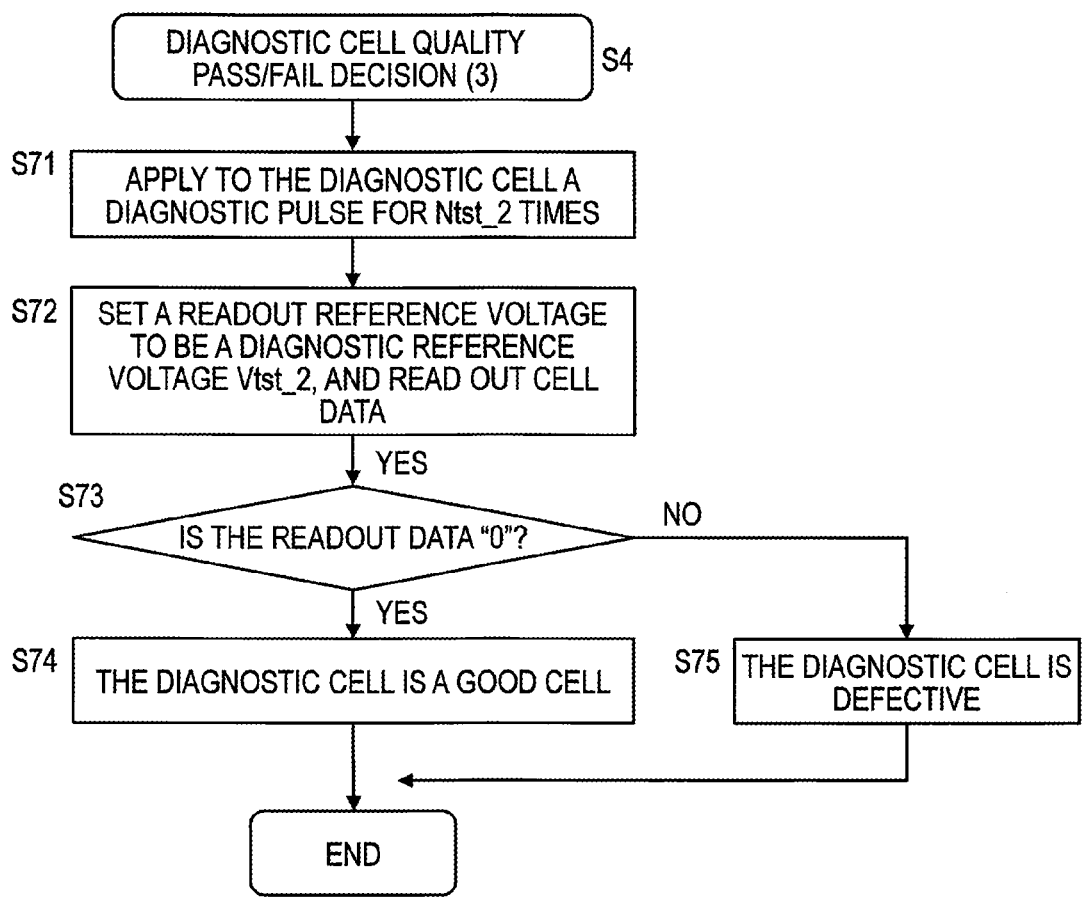
FIG. 17 is a flowchart of an example of the quality pass/fail decision of the diagnostic target cell according to the third embodiment.

FIG. 17 is a flowchart of an example of the quality pass/fail decision of the diagnostic target cell according to the third embodiment. The quality pass/fail decision of the diagnostic target cell in FIG. 17 is also executed by the controller 3 or the control circuit 33 of the flash memory. For simplicity, the following description will be given on assumption that the execution is made by the controller 3.

In the third embodiment also, as a premise when the diagnosis is started, the threshold voltage Vth of the diagnostic target cell in the erase state in a diagnostic target block is set to be a threshold voltage in a fixed narrow range through an erase verification process. The threshold voltage in the erase state is defined to be a Vth_er.

The controller 3 applies to the diagnostic target cell a diagnostic program pulse with the diagnostic reference pulse count Ntst_2 (S71), and performs diagnostic readout in which the readout reference voltage Vref is replaced by the diagnostic reference voltage Vtst_2, so as to read out data in the diagnostic cell (S72). The controller 3 then checks whether or not the readout data of the diagnostic target cell is "0" (S73). The above application of the diagnostic program pulse and the readout of data in the diagnostic cell are performed in the following manner, for example. Namely, the controller 3 inputs to the flash memory a diagnostic program command together with diagnostic data, to cause the flash memory to apply the diagnostic program pulse, and thereafter, the controller 3 inputs a diagnostic read command to cause to output the diagnostic data of the diagnostic target page.

If the diagnostic readout data of the diagnostic target cell is data "0" (YES in S73), the controller 3 determines the diagnostic target cell to be a good cell (S74), whereas if the diagnostic readout data is data "1" (NO in S73), determines to be a defective cell (S75).

Also in the case the control circuit 33 in the flash memory FLM executes the diagnostic process depicted in FIG. 17, the controller inputs a diagnostic program command to the flash memory FLM together with one-page diagnostic data, similar to the description in FIGS. 11 and 14. In response thereto, the control circuit 33 in the flash memory FLM executes the diagnostic process depicted in FIG. 17, to output a diagnostic result indicating whether the diagnostic target cell is a good product or a defective product.

In either case, in the diagnostic process according to the third embodiment, the number of times of the diagnostic readout is only one, so that the process can be completed in a short time.

The diagnostic process according to the present embodiment is executed for all blocks in the flash memory in which data are stored. As a result, a block in which as many defective cells as being incapable of error correction by the error check code are detected, is determined to be a defective block. Further, when the number of defective blocks in the flash memory exceeds a predetermined reference count, it is determined that the life of the flash memory comes to the end.

In the above-mentioned embodiments, preferably, the diagnostic reference voltage Vtst is lower than the readout reference voltage Vref by a predetermined readout operation margin voltage. By setting the diagnostic reference voltage Vtst to be such a voltage, it is possible to appropriately maintain the erase state of the diagnostic target cell even after the diagnosis, and maintain data stored in the diagnostic target block.

As having been described, according to the present embodiments, it is possible to diagnose whether or not a flash memory with data being stored therein is deteriorated, while maintaining the stored data.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A memory device comprising:
a memory block configured to include a plurality of cells each including an erase state in which first data is stored and a program state in which second data is stored, respectively; and
a control circuit configured to execute, in response to a program command, program operation of applying a pulse to each cell to charge an electric charge and transferring the cell from the erase state to the program state,
wherein the control circuit executes, in response to a diagnostic command, diagnostic operation of applying to a diagnostic target cell the pulse within a range that the diagnostic target cell in the erase state in a memory block including stored data is not shifted to the program state, and checking whether or not a charge speed of the diagnostic target cell is faster than or equal to a charge speed of a slowest-speed cell whose charge speed is the slowest among normal cells.

2. The memory device according to claim 1, wherein the checking in the diagnostic operation includes a checking whether or not a pulse count required for a threshold voltage of the diagnostic target cell to reach a diagnostic reference voltage, which is lower than a readout reference voltage to distinguish the erase state from the program state, is smaller than or equal to a pulse count required for a threshold voltage of the slowest-speed cell to reach the diagnostic reference voltage.

3. The memory device according to claim 2, wherein data of the diagnostic reference voltage and data of a pulse count required for the threshold voltage of the slowest-speed cell to reach the diagnostic reference voltage are stored.

4. The memory device according to claim 1, wherein
the checking in the diagnostic operation includes a checking whether or not a threshold voltage of the diagnostic target cell when a diagnostic reference pulse count is applied to the diagnostic target cell is higher than or equal to a diagnostic reference voltage which a threshold voltage of the slowest-speed cell reaches when the diagnostic reference pulse count is applied to the slowest-speed cell, and
wherein the diagnostic reference pulse count is a diagnostic pulse count required for a threshold voltage of a fastest-speed cell whose charge speed is the fastest among the normal cells to reach a first voltage, which is lower than a readout reference voltage to distinguish the erase state from the program state, from the erase state.

5. The memory device according to claim 4, wherein data of the diagnostic reference pulse count and data of the diagnostic reference voltage are stored.

6. The memory device according to claim 1, wherein charge speed data of a cell whose charge speed is the slowest among the normal cells is stored.

7. A storage apparatus comprising:
a memory device which includes a memory block configured to include a plurality of cells each having an erase state in which first data is stored and a program state in which second data is stored, respectively, and is configured to execute, in response to a program command, program operation of applying a pulse to each cell to charge an electric charge and transferring the cell from the erase state to the program state; and
a controller which issues, in response to a write request, a program command to the memory device to cause the memory device to execute the program operation,
wherein the controller executes, in response to a diagnostic request, diagnostic operation of applying to a diagnostic target cell the pulse within a range that the diagnostic target cell in the erase state in a memory block including stored data is not transferred to the program state, and checking whether or not a charge speed of the diagnostic target cell is faster than or equal to a charge speed of a cell whose charge speed is the slowest among normal cells.

8. The storage apparatus according to claim 7, wherein the checking in the diagnostic operation includes a checking whether or not a pulse count required for a threshold voltage of the diagnostic target cell to reach a diagnostic reference voltage, which is lower than a readout reference voltage to distinguish the erase state from the program state, is smaller than or equal to a pulse count required for a threshold voltage of the slowest-speed cell to reach the diagnostic reference voltage.

9. The storage apparatus according to claim 8, wherein data of the diagnostic reference voltage and data of a pulse count required for the threshold voltage of the slowest-speed cell to reach the diagnostic reference voltage are stored.

10. The storage apparatus according to claim 7, wherein
the checking in the diagnostic operation includes a checking whether or not a threshold voltage of the diagnostic target cell when a diagnostic reference pulse count is applied to the diagnostic target cell is higher than or equal to a diagnostic reference voltage which the threshold voltage of the slowest-speed cell reaches when the diagnostic reference pulse count is applied to the slowest-speed cell, and
wherein the diagnostic reference pulse count is a diagnostic pulse count required for a threshold voltage of a fastest-speed cell whose charge speed is the fastest among the normal cells to reach a first voltage, which is lower than a readout reference voltage to distinguish the erase state from the program state, from the erase state.

11. The storage apparatus according to claim 10, wherein data of the diagnostic reference pulse count and data of the diagnostic reference voltage are stored.

12. The storage apparatus according to claim 7, wherein charge speed data of a cell whose charge speed is the slowest among the normal cells is stored.

13. A method of diagnosing a storage apparatus including a memory device which includes a memory block configured to include a plurality of cells, each having an erase state in which first data is stored and a program state in which second data is stored, respectively, and is configured to execute, in response to a program command, program operation of applying a pulse to each cell to charge an electric charge and transferring the cell from the erase state to the program state, the method comprising:
applying the pulse to a diagnostic target cell in the erase state in a memory block including stored data, within a range that the diagnostic target cell is not transferred to the program state; and
checking whether or not a charge speed of the diagnostic target cell is faster than or equal to a charge speed of a cell whose charge speed is the slowest among normal cells.

* * * * *